United States Patent
Ye et al.

(10) Patent No.: US 12,305,012 B2
(45) Date of Patent: May 20, 2025

(54) METHOD FOR PREPARING INTERNAL LASER INDUCED CARBONIZATION LAYER OF ARAMID FIBER RESIN MATRIX COMPOSITE

(71) Applicant: JIANGSU UNIVERSITY, Zhenjiang (CN)

(72) Inventors: Yunxia Ye, Zhenjiang (CN); Zhao Yuan, Zhenjiang (CN); Guanglei Chen, Zhenjiang (CN); Xudong Ren, Zhenjiang (CN); Yinqun Hua, Zhenjiang (CN)

(73) Assignee: JIANGSU UNIVERSITY, Zhenjiang (CN)

( * ) Notice: Subject to any disclaimer, the term of this patent is extended or adjusted under 35 U.S.C. 154(b) by 0 days.

(21) Appl. No.: 18/279,074

(22) PCT Filed: Mar. 24, 2023

(86) PCT No.: PCT/CN2023/083622
§ 371 (c)(1),
(2) Date: Aug. 28, 2023

(87) PCT Pub. No.: WO2023/193614
PCT Pub. Date: Oct. 12, 2023

(65) Prior Publication Data
US 2025/0019510 A1 Jan. 16, 2025

(30) Foreign Application Priority Data
Apr. 7, 2022 (CN) .................. 202210359040.X

(51) Int. Cl.
*C08J 7/12* (2006.01)
*B23K 26/53* (2014.01)
*H05K 3/10* (2006.01)

(52) U.S. Cl.
CPC ............ *C08J 7/123* (2013.01); *B23K 26/53* (2015.10); *H05K 3/105* (2013.01);
(Continued)

(58) Field of Classification Search
CPC ....... C08J 2377/10; C08J 7/123; C08L 77/10; B23K 26/00–707; H05K 3/105; H05K 2203/107
See application file for complete search history.

(56) References Cited

U.S. PATENT DOCUMENTS

| | | | |
|---|---|---|---|
| 6,015,872 A * | 1/2000 | Kawakita ............ | C08G 59/182 528/102 |
| 12,006,411 B1 * | 6/2024 | Hreha ................. | C08J 5/243 |
| 2003/0042657 A1 | 3/2003 | Dublineau et al. | |

FOREIGN PATENT DOCUMENTS

| | | |
|---|---|---|
| CN | 110951110 A | 4/2020 |
| CN | 114716717 A | 7/2022 |

(Continued)

*Primary Examiner* — Kregg T Brooks
(74) *Attorney, Agent, or Firm* — Bayramoglu Law Offices LLC

(57) ABSTRACT

A preparation method for an internal laser-induced carbonization layer of aramid fiber resin matrix composite material is provided. The surface of sample of aramid fiber resin matrix composite material is wiped with anhydrous ethanol; the sample of aramid fiber resin matrix composite material was placed on the laser sample platform, and the defocusing amount between the laser focus and the upper surface of the sample was negative. Infrared picosecond laser was used to scan the sample of aramid fiber resin matrix composite material for several times. Since the laser absorption rate of the surface epoxy resin was very low, most of the laser energy passed through the epoxy resin layer and directly acted on the internal aramid fiber. The laser carbonized the internal aramid fiber without damaging the surface resin, and formed a carbonized line along the laser scanning path (Continued)

to realize the conductivity of aramid fiber resin matrix composite.

10 Claims, 3 Drawing Sheets

(52) U.S. Cl.
CPC ........ *C08J 2363/00* (2013.01); *C08J 2377/10* (2013.01); *H05K 2203/107* (2013.01)

(56) References Cited

FOREIGN PATENT DOCUMENTS

| | | | | |
|---|---|---|---|---|
| JP | H09316217 A | 12/1997 | | |
| JP | 2011056583 A | 3/2011 | | |
| WO | WO-0223962 A2 * | 3/2002 | ......... | C23C 18/1608 |

* cited by examiner

METHOD FOR PREPARING INTERNAL LASER INDUCED CARBONIZATION LAYER OF ARAMID FIBER RESIN MATRIX COMPOSITE

CROSS REFERENCE TO THE RELATED APPLICATIONS

This application is the national phase entry of International Application No. PCT/CN2023/083622, filed on Mar. 24, 2023, which is based upon and claims priority to Chinese Patent Application No. 202210359040.X, filed on Apr. 7, 2022, the entire contents of which are incorporated herein by reference.

TECHNICAL FIELD

The present disclosure relates to the technical field of laser processing, and to a laser modification method of an aramid fiber reinforced composite material.

BACKGROUND

Aramid fiber reinforced resin matrix composites (Aramid Fiber Reinforced Polymer, AFRP for short), is made of high strength aramid fiber as reinforcing, crystallized advanced composite resin as matrix, and have high specific strength and specific stiffness, good fatigue resistance, can design strong advantages. With the development of design and manufacturing technology of aramid fiber reinforced resin matrix composites, aramid fiber reinforced resin matrix composites can gradually replace components of some key structural parts, and are widely used as lightweight materials in aerospace field.

In the field of aerospace, aramid fiber reinforced resin matrix composite material is mainly used for aerospace equipment shell and skin. Spacecraft need to bury or paste a variety of sensors on the surface of the structure to achieve some of its functions, which involves the distribution of circuits, the traditional method is to lay out a large number of lines in its interior, but this method will make the lines occupy the internal space is not rich, for spacecraft such devices have high demand for internal space, The space occupied by the wire is a waste of its internal space, but also has a certain impact on its overall design.

SUMMARY

An objective of the present disclosure is to provide a preparation method of laser induced carbonization layer inside aramid fiber resin matrix composite material. Based on the difference of laser energy absorption rate between aramid fiber and resin, the aramid fiber resin matrix composite material is scanned by infrared picosecond laser to realize high temperature carbonization of the aramid fiber layer below the surface resin, so as to realize the conductive function.

A technical solution adopted by the present disclosure relates to a preparation method for an internal laser induced carbonization layer of an aramid fiber resin matrix composite material, which is specifically implemented in accordance with the following steps.

Step 1: wiping the surface of the sample of aramid fiber resin matrix composite material to ensure that there is no stain on the surface;

Step 2: placing the sample of aramid fiber resin matrix composite material on the laser sample platform, where the defocusing amount between the laser focus and the upper surface of the sample is negative, so that the laser focus is located in the internal horizontal plane of the material; and Step 3: using low power and high speed infrared picosecond laser to scan the sample of aramid fiber resin matrix composite; setting a specific scanning path and processing path, so that the aramid fiber layer under the surface resin can be carbonized under the condition of high temperature and oxygen, to form a specific carbonization line.

In the above solution, the thickness of resin layer on the surface of aramid fiber resin matrix composite material in step 1 is 0.1 mm to 0.3 mm.

In the above solution, the defocus between the laser focus and the upper surface of the sample in the second step is −1 mm to −10 mm.

In the solution mentioned above, the wavelength of midinfrared picosecond laser in step 3 is 1064 nm.

In the above solution, the laser power used in step 3 is 4 w to 15 w, and the scanning speed is 500 mm/s to 2000 mm/s.

In the above solution, the scanning times of the sample of aramid fiber resin matrix composite material in step 3 are 6 to 12 times, and the time interval of each scanning is 1 s to 2 s.

Beneficial Effects of the Present Disclosure

1) The present disclosure selects infrared picosecond laser to prepare carbonization layer inside aramidon fiber resin matrix composite material, and prepares the internal carbonization layer of aramidon fiber resin matrix composite material without damaging the surface resin, realizing the innovation and breakthrough of picosecond laser in the preparation experiment and process of the internal carbonization layer of aramidon fiber resin matrix composite material.

2) The present disclosure has simple preparation process, low price and high efficiency. The internal carbonization layer of aramid fiber resin matrix composite material prepared by the present disclosure can be widely used in all kinds of aerospace equipment, promote the lightweight design of spacecraft and save a lot of space inside, and has potential application value for aircraft in electromagnetic wave stealth.

The attached drawings have reference numbers as follows:

1—Laser scanning head; 2—Laser beam; 3—aramid fiber resin matrix composite material internal carbonization layer circuit; 4 aramid fiber resin matrix composite material; 5—aramid fiber resin matrix composites internal carbonization layer; 6—laser scanning carbonized bending circuit; 7—Laser scanning carbonized microstructures.

DETAILED DESCRIPTION OF THE EMBODIMENTS

The following is a clear and complete description of the technical solution in the embodiment of the present disclosure in combination with the drawings attached to the embodiment of the present disclosure. Obviously, the described embodiment is only a part of the embodiment of the present disclosure, but not the whole embodiment. Based on the embodiments of the present disclosure, all other embodiments obtained by ordinary technical personnel in the field without creative labor are within the scope of protection of the present disclosure.

Based on the difference in laser energy absorption rate of resin matrix and fiber in the composite material, the internal fiber of the composite material is carbonized by laser to give it conductive ability, which can replace the traditional wire to achieve conductive function, which is helpful to promote the lightweight design of spacecraft and save a lot of space inside. In addition, microstructures can be fabricated inside composite materials by carbonizing fibers inside the materials, which can absorb incident electromagnetic waves and has potential application value for aircraft in electromagnetic wave stealth.

Embodiment 1

The picosecond solid state laser adopted in the present disclosure has a wavelength of 1064 nm, a pulse width of 15 ps and a repetition frequency of 50 KHz. Among them, the power adopted in Embodiment 1 is 4.5 W and the scanning speed is 1000 mm/s. The aramid fiber resin matrix composite material of the present disclosure is prepared by prepreg cloth laminating process. It is composed of kevlar-29 fabric and epoxy resin with a thickness of 1 mm. The volume number of epoxy resin is 42% and the volume fraction of fiber is 58%.

The preparation of carbonized layer by infrared picosecond laser inside aramid fiber resin matrix composite includes the following steps:

Step 1: Wipe the surface of the sample of aramid fiber resin matrix composite material to ensure that there is no stain on the surface;

Step 2: Place the sample of aramid fiber resin matrix composite material on the laser sample platform. The defocusing amount between the laser focus and the upper surface of the sample is −3 mm, so that the laser focus is located in the internal horizontal plane of the material.

Figure 1:
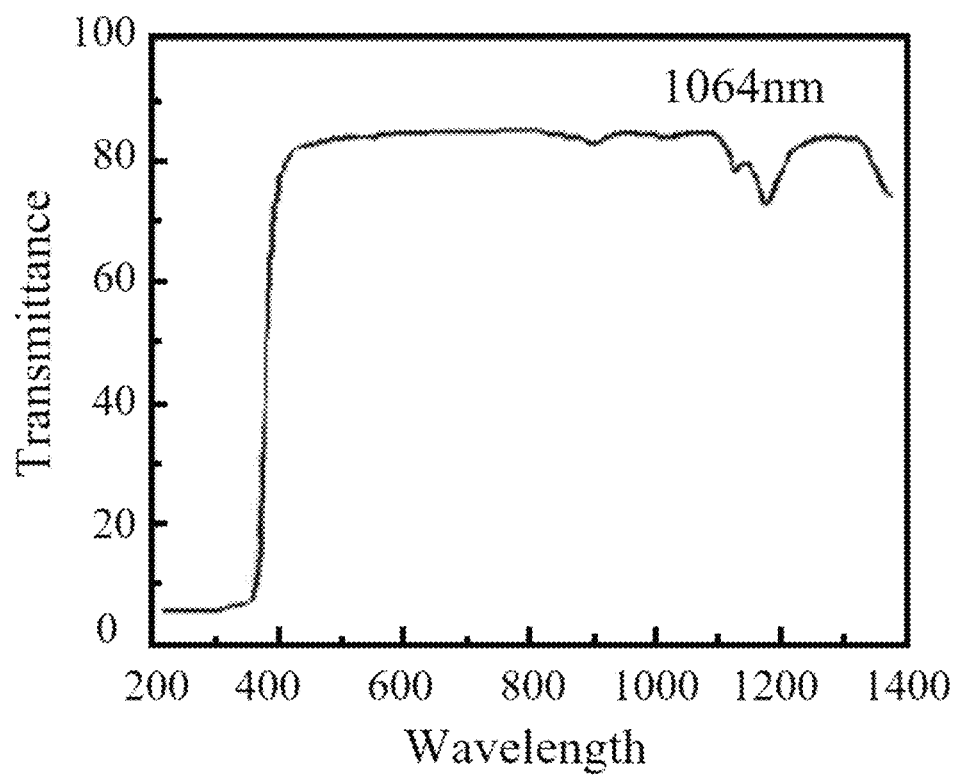
FIG. 1 is the transmission spectrum of 1 mm thick epoxy resin plate in the method of preparing carbonization layer by infrared picosecond laser inside arylon fiber resin matrix composite material of the present disclosure.
Figure 2:
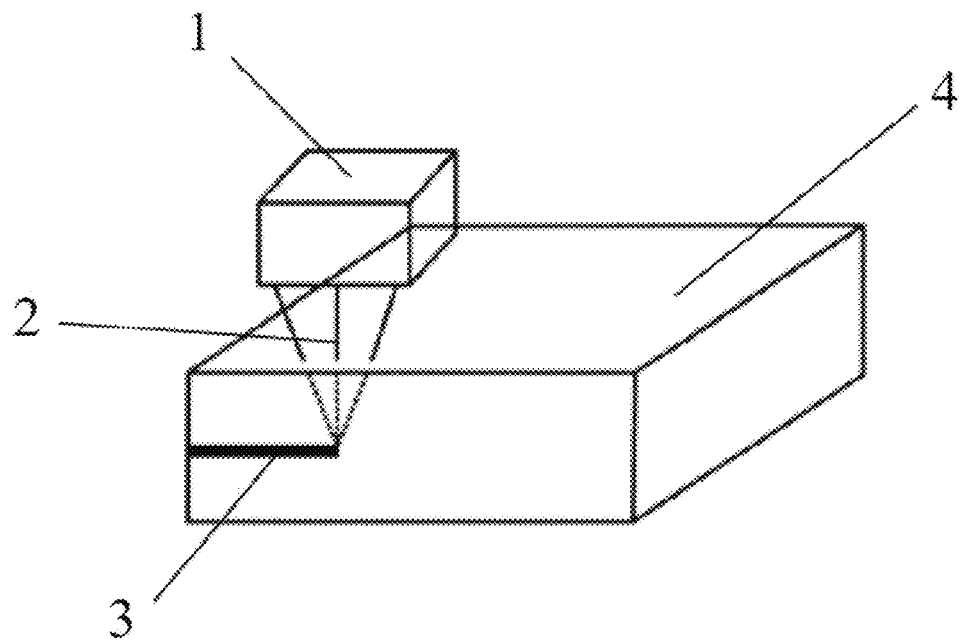
FIG. 2 is a schematic diagram of laser scanning in the method of infrared picosecond laser preparation of carbonization layer inside arylon fiber resin matrix composite material of the present disclosure.

As shown in FIG. 1, when the infrared laser acts on the aramid fiber resin matrix composite material, the 1 mm thick epoxy resin plate absorbs less than 15% of the laser energy. Therefore, when the laser acts on the aramid fiber matrix composite material, most of the laser energy passes through the epoxy resin layer and directly acts on the internal aramid fiber. The laser carbonizes the internal aramid fiber without damaging the surface resin. A carbonized line is formed as the laser scans the path, as shown in FIG. 2.

Step 3: Infrared picosecond laser with power of 4.5 w and scanning speed of 1000 mm/s was used to scan 100 mm×50 mm arylon fiber resin matrix composite material samples for 8 times. A carbonized circuit with a length of 50 mm and a width of 0.1 mm was obtained inside the material, and the resistivity of the carbonized circuit was measured to be $4.6×10^{-5}$ Ω·m.

Figure 3:
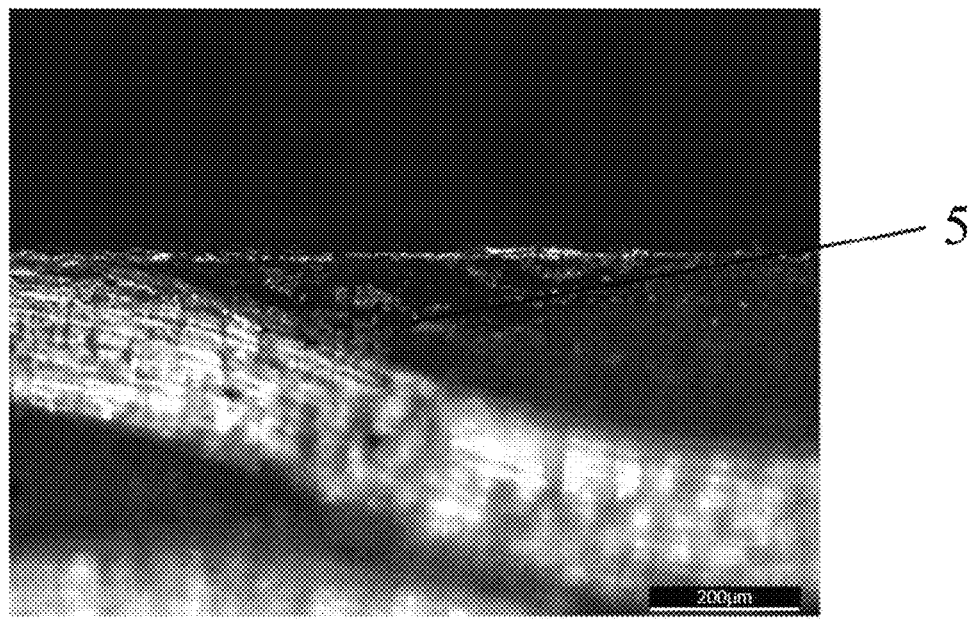
FIG. 3 is a scanning electron microscope image of the aramid fiber resin matrix composite in the method of preparing carbonization layer by infrared picosecond laser inside the aramid fiber resin matrix composite.

Because the surface epoxy resin has low laser absorption, the laser beam passes through the resin and directly heats the aramid fiber. The aramid fiber can be ablated at a lower power without destroying the surface resin. The aramid fiber located in the sample of aramid fiber resin matrix composite material is in an anoxic environment, so the aramid fiber layer below the surface resin achieves carbonization at high temperature and anoxic, as shown in FIG. 3. This carbonized layer is a good conductive material, so as to realize the conductive function of aramid fiber resin matrix composites.

Embodiment 2

The laser parameters and materials used are the same as those in Embodiment 1.

Step 1: Wipe the surface of the sample of aramid fiber resin matrix composite material to ensure that there is no stain on the surface.

Step 2: Place the sample of aramid fiber resin matrix composite material on the laser sample platform. The defocusing amount between the laser focus and the upper surface of the sample is −2 mm, so that the laser focus is located in the internal horizontal plane of the material.

Step 3: The infrared picosecond laser with the power of 10 w and the scanning speed of 1000 mm/s was used to scan the arylon fiber resin matrix composite material samples of 100 mm×50 mm for 10 times. A carbonized circuit with a length of 50 mm and a width of 0.2 mm is obtained inside the material. The resistivity of the carbonized circuit is $4.1×10^{-5}$ Ω·m.

Embodiment 3

The laser parameters and materials used are the same as those in Embodiment 1.

Step 1 and Step 2 are the same as embodiment 2

Figure 4:
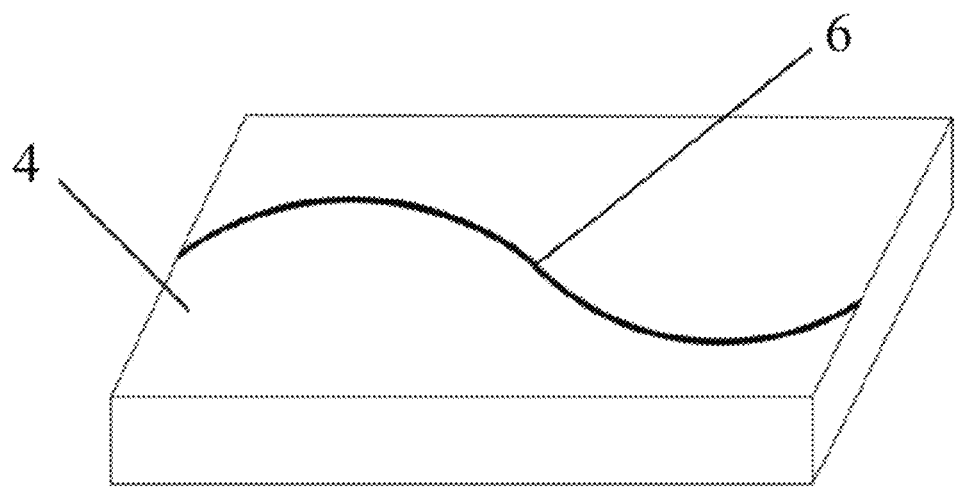
FIG. 4 is a schematic diagram of laser scanning carbonized bending line in the method of preparing carbonized layer by infrared picosecond laser inside arylon fiber resin matrix composite material of the present disclosure.

Step 3: Infrared picosecond laser with power of 15 w and scanning speed of 1000 mm/s was used to scan the arylon fiber resin matrix composite material samples of 100 mm×50 mm for 12 times. A carbonized curved line 150 mm long and 0.2 mm wide is obtained inside the material, as shown in FIG. 4. The resistivity of the carbonized line is $3.6×10^{-5}$ Ω·m.

Embodiment 4

The laser parameters and materials used are the same as those in Embodiment 1.

Step 1 and Step 2 are the same as embodiment 2

Step 3: Infrared picosecond laser with power of 15 w and scanning speed of 1000 mm/s was used to scan the arylon fiber resin matrix composite material samples of 100 mm×50 mm for 12 times. Several micro-structures of "mouth" shape with an outer length of 200 um and a line width of 30 um are obtained inside the material, as shown in FIG. 4. The absorption of terahertz wave was measured.

Combined with the attached FIG. 2, it can be seen that the laser scanning head 1 sends out laser beam 2 to scan the internal fiber layer of aramid fiber resin matrix composite 4 to obtain the internal carbonized layer line 3 of aramid fiber resin matrix composite.

Combined with the scanning electron microscope image attached in FIG. 3, the carbonization layer obtained by the method of the present disclosure is a good conductive material, so as to realize the conductive function of aramid fiber resin matrix composite.

Combined with the attached FIG. 4, the laser scanning carbonized bending circuit 6 scanned on the aramid fiber resin matrix composite material 4 can realize the conduction function in complex environment.

Figure 5:
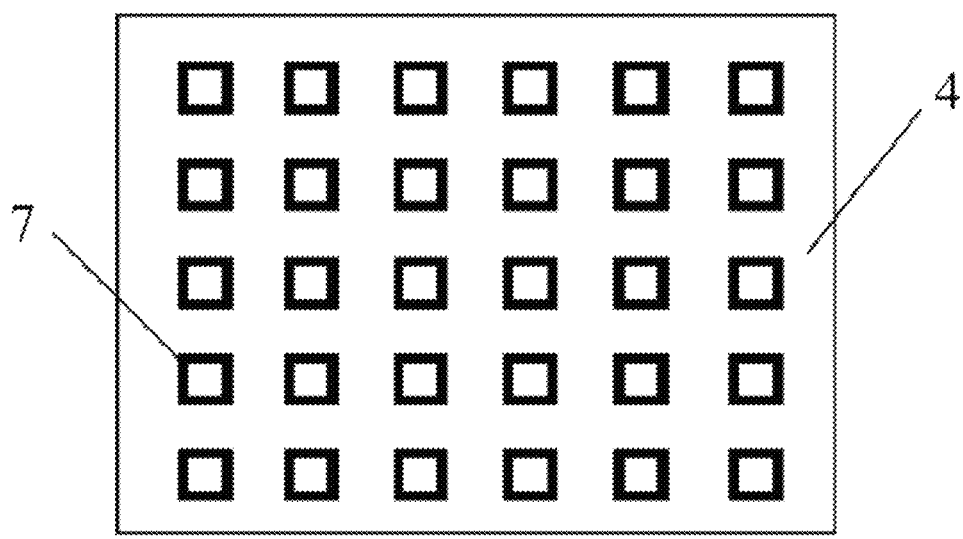
FIG. 5 is a schematic diagram of laser scanning carbonization micro-structure in the method of infrared picosecond laser preparation of carbonization layer inside arylon fiber resin matrix composite material of the present disclosure.

Combined with the attached FIG. 5, the laser scanning carbonized micro structure 7 obtained by the method of the present disclosure has absorption effect on terahertz waves.

In the present disclosure, the surface of the sample of arylon fiber resin matrix composite material is wiped to ensure that there is no stain on the surface; This is because when the laser irradiation on the surface of the aramid fiber resin matrix composite sample, the stain on the surface of the aramid fiber resin matrix composite material will absorb part of the laser energy, resulting in the aramid fiber resin matrix composite sample 1. The laser energy absorbed by the part is reduced, and the high temperature generated when the laser is applied to the surface stain burns the surface resin.

The defocus of the laser focus and the upper surface of the aramid fiber resin matrix composite material sample is −1 mm to −10 mm, so that the laser focus is located in the internal horizontal plane of the aramid fiber resin matrix composite material sample.

The infrared picosecond laser with laser power of 4 w to 15 w and scanning speed of 500 mm/s to 2000 mm/s was used to scan the sample of arylon fiber resin matrix composite material for 6 to 12 times.

A low power and high speed infrared picosecond laser was used to scan the samples of aramid fiber resin matrix composites. Because the surface epoxy resin has low laser absorption, the laser beam passes through the resin and directly heats the aramid fiber. With low power, the aramid fiber can be ablated without destroying the surface resin. The aramid fiber located inside the sample of aramid fiber resin matrix composite material is in an anoxic environment, so the aramid fiber layer below the surface resin achieves carbonization under the condition of high temperature and anoxia. This carbonization layer is a good conductive material. Thus, the conductive function of aramid fiber resin matrix composite can be realized, and it has potential application value for aircraft in electromagnetic wave shadow body.

In the description of this specification, the reference terms "an embodiment", "some embodiments", "examples", "specific examples", or "some examples", etc., refer to the specific features, structures, materials or characteristics described in conjunction with such embodiments or examples as contained in at least one embodiment or example of the present disclosure. In this specification, schematic representations of the above terms do not necessarily refer to identical embodiments or examples. Furthermore, the specific features, structures, materials or characteristics described may be combined in an appropriate manner in any one or more embodiments or examples.

Although embodiments of the present disclosure have been shown and described above, it is understood that the embodiments are exemplary and cannot be construed as limitations of the present disclosure, and that they may be altered, modified, replaced or altered by ordinary technicians in the field within the scope of the present disclosure without deviating from the principle and purpose of the present disclosure.

What is claimed is:

1. A method for preparing an internal laser-induced carbonization layer of an aramid fiber resin matrix composite, the aramid fiber resin matrix composite comprising a surface resin layer on the upper surface and an aramid fiber layer under the surface resin layer, comprising the following steps:

step 1: wiping a surface of an aramid fiber resin matrix composite material sample to ensure that there is no stain on the surface of the aramid fiber resin matrix composite material sample;

step 2: placing the aramid fiber resin matrix composite material sample on a laser sample platform, wherein a defocusing amount between a laser focus and the upper surface of the aramid fiber resin matrix composite material sample is negative, so that the laser focus is located in an internal horizontal plane of the aramid fiber resin matrix composite material sample; and step 3: using low power and high speed infrared picosecond laser to scan the aramid fiber resin matrix composite material sample for several times; setting a specific scanning processing path to carbonize the aramid fiber layer without damaging the surface resin layer of the aramid fiber resin matrix composite material sample under a condition of high temperature and hypoxia, to form a specific carbonization line.

2. The method for preparing the internal laser-induced carbonization layer of the aramid fiber resin matrix composite according to claim 1, wherein the defocusing amount between the laser focus and the upper surface of the aramid fiber resin matrix composite sample is −1 mm to −10 mm.

3. The method for preparing the internal laser-induced carbonization layer of the aramid fiber resin matrix composite according to claim 1, wherein in step 3, laser power is 4 w to 15 w, scanning speed is 500 mm/s to 2000 mm/s, and infrared picosecond laser wavelength is 1064 nm.

4. The method for preparing the internal laser-induced carbonization layer of the aramid fiber resin matrix composite according to claim 3, wherein the infrared picosecond laser with laser power of 4.5 w and scanning speed of 1000 mm/s is used to scan the aramid fiber resin matrix composite sample.

5. The method for preparing the internal laser-induced carbonization layer of the aramid fiber resin matrix composite according to claim 3, wherein the infrared picosecond laser with laser power of 10 w and scanning speed of 1000 mm/s is used to scan the aramid fiber resin matrix composite sample.

6. The method for preparing the internal laser-induced carbonization layer of the aramid fiber resin matrix composite according to claim 3, wherein the infrared picosecond laser with laser power of 15 w and scanning speed of 1000 mm/s is used to scan the aramid fiber resin matrix composite sample.

7. The method for preparing the internal laser-induced carbonization layer of the aramid fiber resin matrix composite according to claim 1, wherein in step 3, infrared picosecond laser scans the aramid fiber resin matrix composite sample for 6 to 12 times, and a time interval of each scan is 1 s to 2 s.

8. The method for preparing the internal laser-induced carbonization layer of the aramid fiber resin matrix composite according to claim 1, wherein a thickness of the surface resin layer in the aramid fiber resin matrix composites is 0.1 mm to 0.3 mm.

9. The method for preparing the internal laser-induced carbonization layer of the aramid fiber resin matrix composite according to claim 1, wherein a thickness of the aramid fiber resin matrix composite is 1 mm, a volume number of epoxy resin is 42%, and a volume fraction of fiber is 58%.

10. The method for preparing the internal laser-induced carbonization layer of the aramid fiber resin matrix composite according to claim 1, wherein a sample size of aramid fiber resin matrix composite is 100 mm×50 mm.

* * * * *